(12) United States Patent
Maloberti et al.

(10) Patent No.: US 6,980,144 B1
(45) Date of Patent: Dec. 27, 2005

(54) METHOD FOR REDUCING DAC RESOLUTION IN MULTI-BIT SIGMA DELTA ANALOG-TO DIGITAL CONVERTER (ADC)

(75) Inventors: Franco Maloberti, Plano, TX (US); Jiang Yu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/860,620

(22) Filed: Jun. 3, 2004

(51) Int. Cl.[7] .................................................. H03M 3/00
(52) U.S. Cl. ...................................................... 341/143
(58) Field of Search ............................... 341/143, 144, 341/155

(56) References Cited

U.S. PATENT DOCUMENTS

| | | | |
|---|---|---|---|
| 6,313,774 B1 * | 11/2001 | Zarubinsky et al. | ......... 341/143 |
| 6,462,687 B1 * | 10/2002 | Eshraghi et al. | ............ 341/143 |
| 6,518,903 B1 * | 2/2003 | Perraud et al. | .............. 341/143 |
| 6,781,533 B2 * | 8/2004 | Yap et al. | .................... 341/143 |
| 6,825,784 B1 * | 11/2004 | Zhang | ......................... 341/131 |
| 6,842,129 B1 * | 1/2005 | Robinson | .................... 341/143 |
| 2002/0093442 A1 * | 7/2002 | Gupta | ......................... 341/143 |

* cited by examiner

*Primary Examiner*—Peguy JeanPierre
(74) *Attorney, Agent, or Firm*—Ronald O. Neerings; Wade James Brady, III; Frederick J. Telecky, Jr.

(57) ABSTRACT

A method for reducing the resolution of a digital-to-analog converter in a multi-bit sigma-delta ADC is described. With the addition of digital sigma-delta modulators in the feedback path of a sigma-delta ADC, the truncation errors between the digital word output of the multi-bit sigma-delta ADC to the DAC input can be shaped to higher order than that of the quantization error. Thus, the DAC resolution can be reduced and the implementation of DEM for multi-bit DAC can be avoided. A preferred embodiment comprises selecting an outermost feedback loop in a sigma-delta ADC that has not been replaced and replacing it with a circuit with an equivalent transfer function. The circuit can be further enhanced with an additional term if the order of the noise shaping of the circuit is less than the order of the noise shaping of the sigma-delta ADC.

19 Claims, 5 Drawing Sheets

METHOD FOR REDUCING DAC RESOLUTION IN MULTI-BIT SIGMA DELTA ANALOG-TO DIGITAL CONVERTER (ADC)

TECHNICAL FIELD

The present invention relates generally to a method for signal processing, and more particularly to a method for reducing the resolution of a DAC in a multi-bit sigma-delta ADC.

BACKGROUND

Sigma-delta analog-to-digital modulators, which can be used in a sigma-delta analog-to-digital converter (ADC) or a sigma-delta digital-to-analog converter (DAC), can provide a degree of shaping (filtering) of quantization noise that can be present. The higher the order of the sigma-delta modulator, the further the quantization noise is pushed into the frequency band, away from the signal being converted and the quantization noise. As such, sigma-delta ADCs and DACs (and their attendant modulators) have become popular in high frequency and high precision applications.

However, sigma-delta modulators do not offer noise shaping for noise that is due to a mismatch between the unity elements used in a DAC (referred to as a feedback DAC) that is a part of a feedback loop in the sigma-delta modulator and a quantizer. The mismatch can therefore be a problem in the sigma-delta modulator if it is of significant magnitude. The mismatch can result in an overall reduction in the signal-to-noise ratio (SNR) of the sigma-delta modulator.

One solution that can be used to reduce the mismatch that is present in the feedback DAC is to use a feedback DAC with high linearity. Ideally, the feedback DAC should have a linearity corresponding to the final resolution of the quantizer. A useful technique used to improve the DAC linearity is commonly referred to as dynamic element matching (DEM). Its use can reduce the mismatch in the sigma-delta modulator.

One disadvantage of the prior art is that if the feedback DAC has high resolution, then it can potentially be difficult to achieve an effective DEM. A high resolution feedback DAC may require a large number of elements, and too many elements to average can lead to tones in the signal band for signals with low input levels.

A second disadvantage of the prior art is that even if the mismatch can be transformed into noise, it can remain unshaped and become a component in the signal band, thus having an impact on the SNR of the sigma-delta modulator.

SUMMARY OF THE INVENTION

These and other problems are generally solved or circumvented, and technical advantages are generally achieved, by preferred embodiments of the present invention, which provides a method for reducing DAC resolution in the feedback loop of a sigma-delta modulator.

In accordance with a preferred embodiment of the present invention, a method for reducing resolution in a digital-to-analog converter (DAC) in a sigma-delta analog-to-digital converter (ADC) includes selecting an outermost feedback loop in the sigma-delta ADC that has not been replaced and replacing the selected outermost feedback loop with a circuit that has an equivalent transfer function. An additional term can be added to the circuit if the order of the noise shaping performed by the circuit is less than the order of the noise shaping performed by the sigma-delta ADC. The selecting, replacing, and adding can be repeated for all remaining feedback loops in the sigma-delta ADC.

In accordance with another preferred embodiment of the present invention, a method for converting a sub-net of sampled-data networks includes verifying that the sub-net can indeed be converted. If the sub-net can be converted, then the outermost feedback loop that has not already been replaced is selected and then replaced with a circuit with an equivalent transfer function. The selecting and replacing can be repeated for all remaining feedback loops in the sub-net.

An advantage of a preferred embodiment of the present invention is the multi-bit digital-to-analog converters (DACs) in the feedback loop of a sigma-delta modulator can be implemented with a lower number of bits (lower resolution). This means that the DAC can be simpler to implement and can operate without dynamic element matching (DEM). Therefore, this can help to alleviate issues that may exist with the multi-bit DAC.

Another advantage of a preferred embodiment of the present invention is that the possible digital hardware required to dynamically match the unity elements of the DAC is replaced by less complex digital circuitry to achieve digital noise shaping located in the feedback loop.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a second order sigma-delta ADC and its sigma-delta modulator. The invention may also be applied, however, to other sigma-delta ADCs and modulators of differing order (first order and higher). The present invention may also be applied to sampled-data networks in general.

Figure 1:
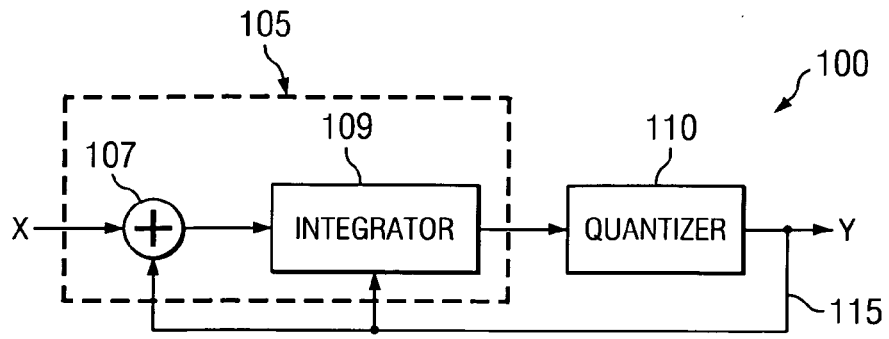
FIG. 1 is a diagram of a sigma-delta modulator.

With reference now to FIG. 1, there is shown a diagram illustrating a sigma-delta modulator 100. The sigma-delta modulator 100 is the heart of a sigma-delta ADC or DAC and basically digitizes an analog signal using a low (or relatively low) resolution quantizer at a high sampling rate. Note that sigma-delta modulator 100 makes use of the oversampling of the analog signal and noise shaping to increase the effective resolution of the conversion. Noise shaping involves the filtering and moving of the quantization noise from within a frequency band of interest into frequency bands above the frequency band of interest.

The sigma-delta modulator 100 achieves a shaping of the quantization noise of its input signal X via the use of a sample-data network 105 that comprises an adder 107 and an integrator 109. The integrator 109, however, may be of higher order. The output of the sample-data network 105 can be provided to a quantizer 110, which can be used to convert the analog output of the sample-data network 105 into a discrete representation. The output of the quantizer 110, Y, may also be the quantized output, which can be subtracted from the input signal X. Note that the quantized output may need to be converted back into an analog signal (via a DAC (not shown)) prior to subtraction from the input signal X.

The quantizer 110 may convert the output of the sample-data network 105 into a series of discrete values. If the quantizer 110 has a relatively high number of bits, then more data can be conveyed in the output signal Y. However, if the quantizer 110 has a relatively high number of bits, then high resolution may also be required in a feedback loop 115.

Figure 2:
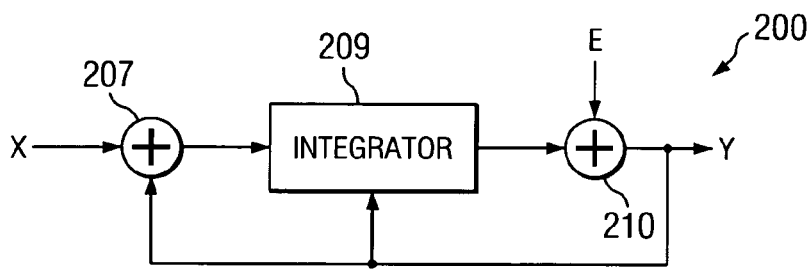
FIG. 2 is a diagram of a linear model of a sigma-delta modulator.

With reference now to FIG. 2, there is shown a diagram illustrating a linear model 200 of a sigma-delta modulator. The linear model 200 of a sigma-delta modulator, such as the sigma-delta modulator 100 shown in FIG. 1, can be derived by replacing components of the sigma-delta modulator 100 with their linear equivalents. The adder 107 and the integrator 109 (both from FIG. 1) are linear elements. They can be directly replaced with linear models adder model 207 and integrator model 209. The quantizer 110 (FIG. 1), however, may not have a linear counterpart. However, the quantizer 110 can be modeled as an additive noise source E that can be added to the output of the integrator model 209 with an adder 210. The additive noise source E may be the result of an error from the operation of the quantizer 110. The error, commonly referred to as quantization error, may arise from a difference in a value of a signal being quantized and its quantized value.

Given a certain transfer function, there is likely to be several different circuit implementations, but they provide the same response at a functional level. For example, a circuit with a unity transfer function can be implemented as simply as a single wire or as complicated as a combination of integrators, adders, and delay units. Note that a circuit with a unity transfer function can also be referred to as a circuit with a no delay transfer function. The use of alternate circuit implementations can enable benefits that are exploited in the present invention.

Figure 3:
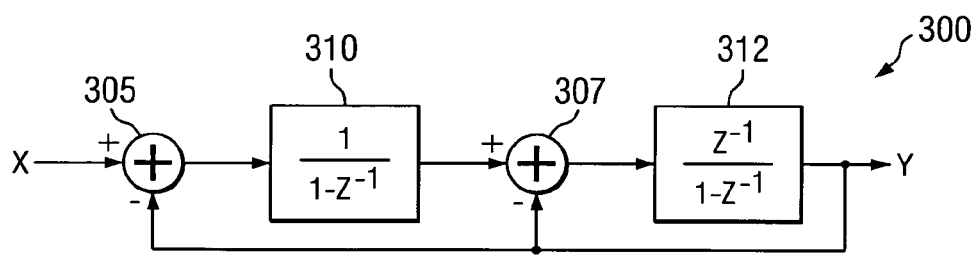
FIG. 3 is a diagram of a circuit with a unit delay transfer function, according to a preferred embodiment of the present invention.

With reference now to FIG. 3, there is shown a diagram illustrating a circuit 300 that has a unit delay transfer function, according to a preferred embodiment of the present invention. The circuit 300 can be an alternate embodiment of a simpler circuit with a single delay transfer function, namely a single wire with a unit delay. The circuit 300 comprises a pair of adders 305 and 307 and a pair of integrators, a first integrator 310 may have a transfer function expressible as $$\frac{1}{1-z^{-1}}$$

while a second integrator 312 may have a transfer function expressible as $$\frac{z^{-1}}{1-z^{-1}}.$$

The circuit 300 has a feedback loop from the output of the circuit 300 to the pair of adders 305 and 307. The transfer function of the circuit 300 can be expressed as $Y=z^{-1}X$, wherein Y is the output of the circuit 300 and X is the input of the circuit.

Figure 4:
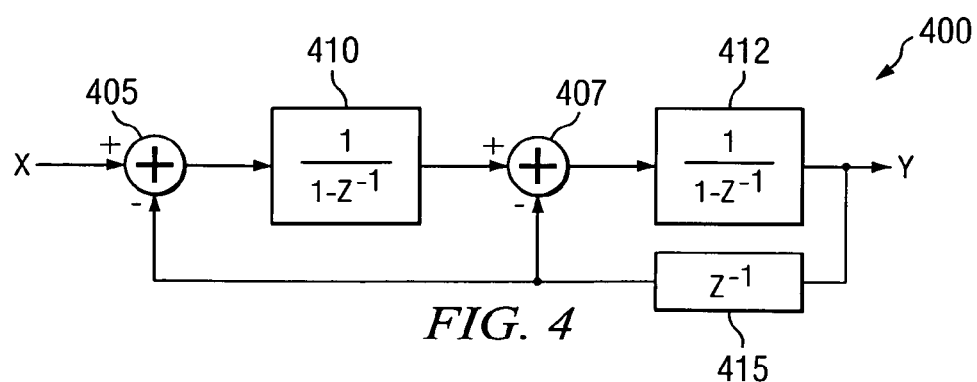
FIG. 4 is a diagram of a circuit with a zero delay transfer function, according to a preferred embodiment of the present invention.

With reference now to FIG. 4, there is shown a diagram illustrating a circuit 400 that has a unity transfer function, according to a preferred embodiment of the present invention. The circuit 400 can be an alternate embodiment of a simpler circuit with a zero delay transfer function, namely a single wire. The circuit 400 comprises a pair of adders 405 and 407 and a pair of integrators 410 and 412. Both integrators 410 and 412 having the same transfer function, expressible as $$\frac{1}{1-z^{-1}}.$$

The circuit 400 also has a unit delay block 415 in a feedback loop from the output of the circuit 400 that can be fedback to the pair of adders 405 and 407. The transfer function of the circuit 400 can be expressed as Y=X, wherein Y is the output of the circuit 400 and X is the input of the circuit 400.

FIGS. 3 and 4 illustrate two different circuits that can be used as replacements for basic circuits with transfer functions that are unity and unity delay. Note that other alternative circuits can be used in place of the circuits 300 and 400 shown in FIGS. 3 and 4 with the same transfer functions. Furthermore, circuits can be created with transfer functions of two delay, three delay, and so forth. The circuits shown in FIGS. 3 and 4 are not intended to restrict the use of replacement circuits to the two circuits 300 and 400. The use of other circuits with equivalent transfer functions can be permitted without altering the spirit of the present invention.

According to a preferred embodiment of the present invention, a sigma-delta generic network can be expanded by replacing a simple sub-network (like a wire or a delay) with an equivalent circuit (the replacement circuit having the same transfer function as the simple sub-network). An initial noise-shaping sigma-delta modulator can be transformed by expansion so that additional of inputs (possibly due to truncation errors) can be accommodated. The additional quantization inputs can be used to reduce the resolution of the DAC in the feedback loop of the sigma-delta modulator. The noise shaping provided by the inclusion of the generic sampled-data expansion networks can help to push the noise mismatch into frequency bands that are beyond the frequency band of interest.

Figure 5:
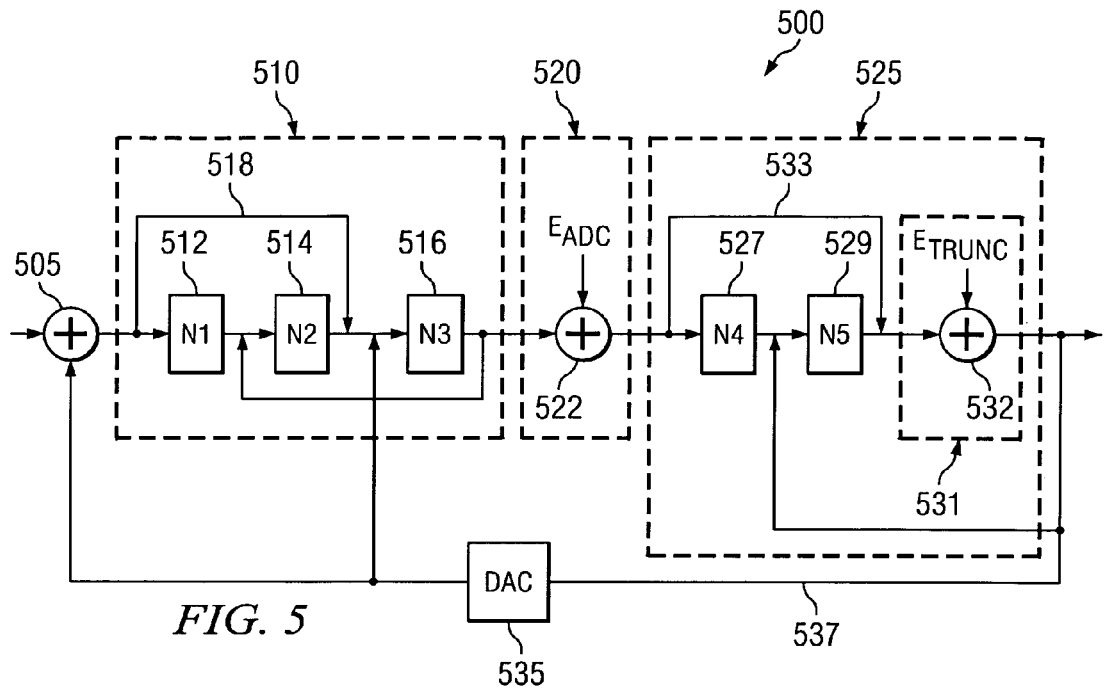
FIG. 5 is a diagram of a circuit made up of sub-nets of generic sampled-data networks that is suitable for expansion, according to a preferred embodiment of the present invention.

With reference now to FIG. 5, there is shown a diagram illustrating a circuit 500 containing a sampled-data sigma-delta modulator with network expansion, according to a preferred embodiment of the present invention. In order to be a candidate for expansion, a sampled-data network should meet certain restrictions. A first restriction requires that the sampled-data network have a single signal input and multi-bit quantization noise inputs. For a sigma-delta modulator, this restriction is typically readily met by a multi-bit sigma-delta modulator. Note that the sigma-delta modulator has a primary quantization noise source in its quantizer (for example, the quantizer 110 (FIG. 1)). A second restriction requires that the sampled-data network does not contain feed-forward or feedback paths across different domains. Domain, in this instance, refers to analog and/or digital domain.

The circuit 500 displays a sigma-delta modulator that meets both restrictions for being a candidate for expansion. The circuit comprises an analog adder 505, an analog domain 510, a quantization noise source $E_{ADC}$ 520 (modeled as a noise source $E_{ADC}$ and an adder 522), a digital domain 525, and a DAC 535. The analog domain 510 can include several subnets, such as subnet N1 512, subnet N2 514, and subnet N3 516, and a feed-forward loop 518. Note that the feed-forward loop 518 remains within the analog domain 510. The digital domain 525 also contains several subnets, such as subnet N4 527 and subnet N5 529. The digital domain 525 also contains a quantization noise source $E_{TRUNC}$ 531 (modeled as a noise source $E_{TRUNC}$ and an adder 532). The digital domain 525 also includes a feed-forward loop 533. Again, the feed-forward loop 533 remains within the digital domain 525. The circuit 500 meets both requirements for using expansion. Note that while the DAC 535 is part of a feedback loop 537 that feeds back into both the analog domain 510 and the digital domain 525 and that the source of the feedback loop 537 is an output of the digital domain 525, the DAC 535 severs the feedback loop 537 prior to it feeding back into the analog domain 510.

Figure 6:
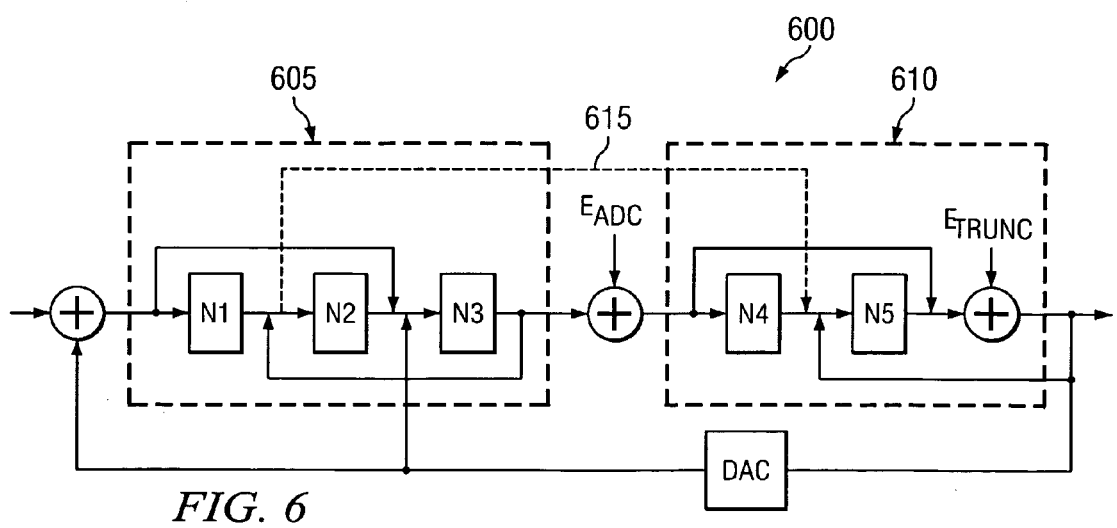
FIG. 6 is a diagram of a circuit made up of sub-nets of generic sampled-data networks that is not suitable for expansion, according to a preferred embodiment of the present invention.

With reference now to FIG. 6, there is shown a diagram illustrating a circuit 600 containing sub-nets of generic sampled-data networks that is not suitable for expansion, according to a preferred embodiment of the present invention. The circuit 600 displays a circuit that does not meet the requirements for expansion. The circuit 600 includes an analog domain 605 and a digital domain 610. However, a feed-forward loop 615 bridges the analog domain 605 and the digital domain 610. Therefore, the second requirement for expansion (the sampled-data network does not contain feed-forward or feedback loops across different domains) is violated.

Meeting the two requirements discussed above may mean that the sampled-data network (sigma-delta modulator) can be a candidate for expansion to exploit noise shaping in order to reduce noise in the network. However, to further optimize the performance gained by the expansion, several design criterions should be considered and adhered to.

In order to simplify the design, a first criterion states that the number of bits in the feedback signal at a first integrator (the integrator closest to the signal input) for a sigma-delta modulator should be at a minimum. However, the noise shaping achieved via the expansion for the feedback loop to the first integrator must be the highest degree of all feedback loops. Therefore, the greatest truncation noise shaping should be placed on the feedback loop for the first integrator.

A second criterion states that the number of bits in the ADC of the sigma-delta modulator should be maximized, depending upon other constraints, such as data rates, operating frequencies, and so forth. A reason for this could be that the output quantization error can decrease (by—6 dB) for each bit used in the ADC.

A third criterion states that the order of the noise shaping of the truncation noise should be higher than the order of the noise shaping of the ADC of the sigma-delta modulator. This criterion can help to ensure that noise truncation receives higher-order noise shaping. A fourth criterion states that internal points in the sigma-delta modulator (both analog and digital) should remain bounded. This criterion is a stability criterion and can imply that the design of the expanded sigma-delta modulator should still be stable.

Figure 7A:
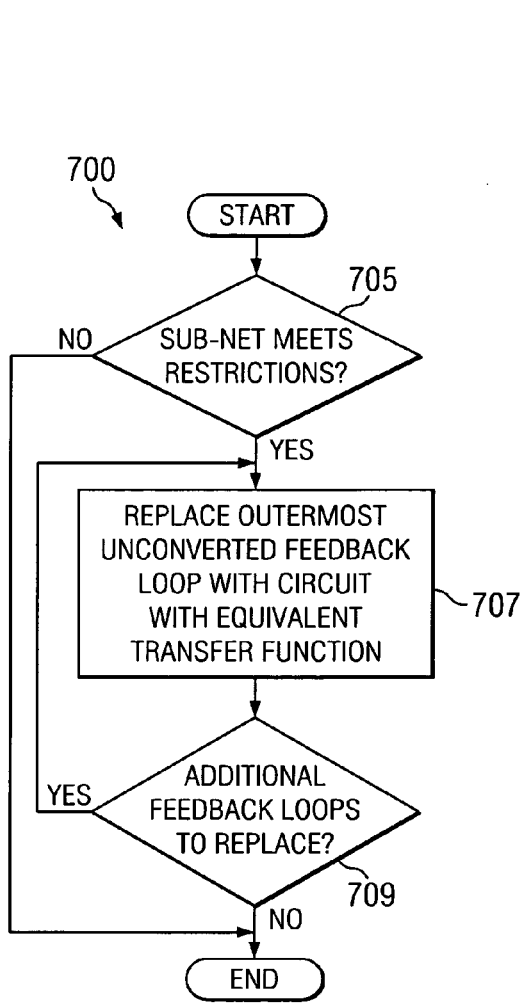
FIG. 7*a* is a diagram of an algorithm for use in converting a sub-net of generic sampled-data networks using circuits with similar transfer functions.

With reference now to FIG. 7a, there is shown a flow diagram illustrating an algorithm 700 for use in converting a sub-net of generic sampled-data networks using circuits with similar transfer functions, according to a preferred embodiment of the present invention. According to a preferred embodiment of the present invention, the algorithm 700 can be used to replace feedback loops that may be present in a sub-net of generic sampled-data networks with circuits (which may be sampled-data networks themselves) with equivalent transfer functions. For example, a feedback loop with a unity transfer function (essentially a wire) can be replaced with a circuit similar to the one shown in FIG. 4. Since the transfer function of the circuit 400 is the same as the transfer function of the feedback loop, the function of the feedback loop does not change.

A first operation in the conversion of the sub-net of generic sampled-data networks may be to verify that the sub-net of generic sampled-data networks is a candidate for conversion (block 705). The verification may require the evaluation of two restrictions, a first restriction requires that the sub-net of generic sampled-data networks has a single signal input and multiple quantization noise inputs and a second restriction requires that there be no feed-forward or feedback loops spanning different domains. A discussion of these two restrictions was provided above. If the sub-net of generic sampled-data networks does not meet both of these restrictions (block 705), then it is not a candidate for conversion and the conversion may terminate.

However, if the sub-net of generic sampled-data networks does meet both of the restrictions (block 705), then it may be a candidate for the conversion and the conversion may proceed. A second operation in the conversion may involve selecting an outermost feedback loop in the sub-net of generic sampled-data networks and replacing it with a circuit with equivalent transfer function (block 707). The outermost feedback loop may be defined as the feedback loop that is closest to the input signal. Depending upon the transfer function of the outermost feedback loop, the circuit used as replacement can differ. For example, if the transfer function of the outermost feedback loop has zero delay, then the circuit that is shown in FIG. 4 may be used as a replacement and if the transfer function of the outermost feedback loop has a single delay, then the circuit that is shown in FIG. 3 may be used as a replacement.

After replacing the outermost feedback loop with a circuit with equivalent transfer function (block 707), the next operation in the conversion may involve the determination if there are further feedback loops to be converted (block 709). If there are no additional feedback loops to replace, then the conversion may terminate. However, if there are additional feedback loops to replace, then the conversion can return to block 707 to select the next outermost feedback loop that has not undergone conversion. Once this feedback loop is selected, the feedback loop can be replaced with a circuit with equivalent transfer function.

Figure 7B:
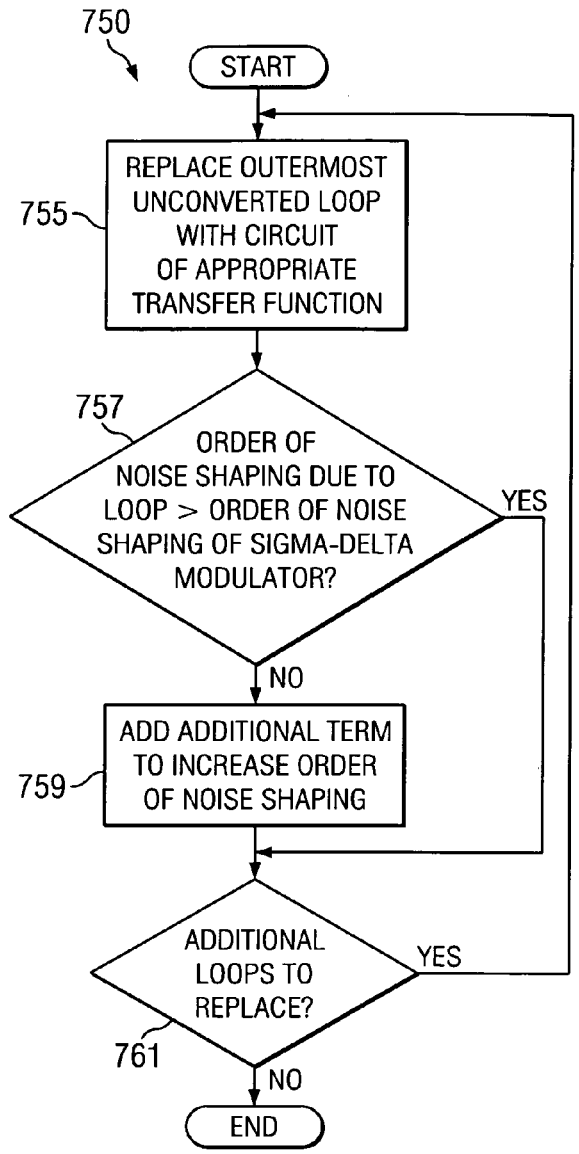
FIG. 7*b* is a diagram of an algorithm for use in the expansion of a sigma-delta modulator to provide noise shaping of a noise mismatch, according to a preferred embodiment of the present invention.

With reference now to FIG. 7b, there is shown a flow diagram illustrating an algorithm 750 for use in the expansion of a sigma-delta modulator to provide noise shaping of a noise mismatch, according to a preferred embodiment of the present invention. According to a preferred embodiment of the present invention, the algorithm 750 can be used to perform the expansion of the sigma-delta modulator after the sigma-delta modulator has been verified as being in compliance with the two requirements for being a candidate for expansion.

The algorithm 750 operates by replacing each feedback loop in the sigma-delta modulator, from the outermost feedback loop (the loop feeding back to the integrator closest to the signal input) and then sequentially working inward until all feedback loops have been replaced. For discussion purposes, assume that no feedback loops in the sigma-delta modulator have been replaced.

Then, the first operation may be to replace the outermost feedback loop with a circuit having the same transfer function as the feedback loop being replaced (block 755). For example, if the feedback loop has zero delay, then the circuit that replaces the feedback loop may have the appearance of the circuit 400 (FIG. 4). After replacing the feedback loop with a circuit with equivalent transfer function (block 755), the next operation can be to determine if the order of the noise shaping in the replaced feedback loop is greater than the order of the noise shaping of the sigma-delta modulator (block 757). If the order of the noise shaping in the replaced feedback loop is not greater than the order of the noise shaping of the sigma-delta modulator, then an additional term can be added to the circuit to increase the order of the noise shaping so that it exceeds that of the sigma-delta modulator (block 759).

If the order of the noise shaping in the replaced feedback loop exceeds the order of the noise shaping of the sigma-delta modulator (block 757) or if an additional term has been added to the circuit to increase the order of the noise shaping (block 759), then the processing for the loop is complete. Any remaining loops in the sigma-delta modulator can be replaced in a similar fashion (block 761). After all of the loops in the sigma-delta modulator has been replaced (block 761), the expansion is complete.

Figure 8:
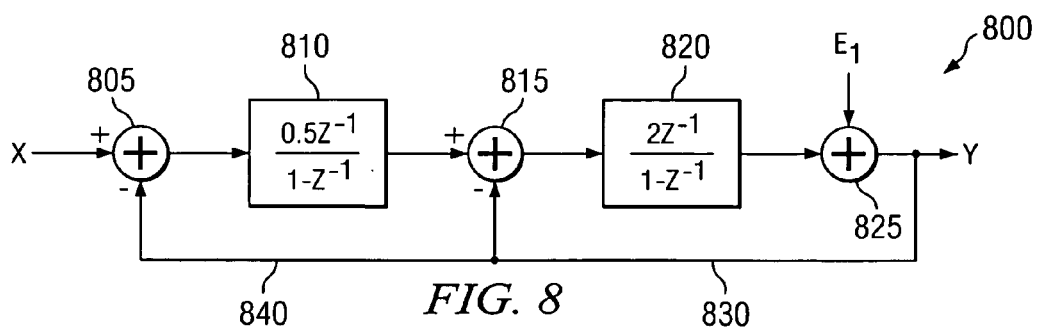
FIG. 8 is a diagram of a second-order sigma-delta modulator.

With reference now to FIG. 8, there is shown a diagram illustrating an exemplary second-order sigma-delta modulator 800. The second-order sigma-delta modulator 800 is comprised of a pair of integrators 810 and 820. Each integrator is paired with an adder, such as an adder 805 for the integrator 810 and an adder 815 for the integrator 820, that can be used to combine a feedback signal with an input to the integrators. The second-order sigma-delta modulator 800 has a certain quantization noise that is due to the resolution of its quantizer (not shown). The quantization noise can be modeled as a noise source $E_1$ and an adder 825. Since there are two integrators (integrator 810 and 820), there can be two feedback loops 830 and 840 that can carry the output of the sigma-delta modulator 800 back to the integrators. Note that as displayed, the feedback loop 840 to the first integrator 810 can be referred to as the outermost feedback loop. The second-order sigma-delta modulator 800 can be described as:

$$Y = z^{-2}X + (1-z^{-1})^2 E_1$$

wherein Y is the output of the second-order sigma-delta modulator 800, X is its input, and $E_1$ is the quantization error.

Figure 9:
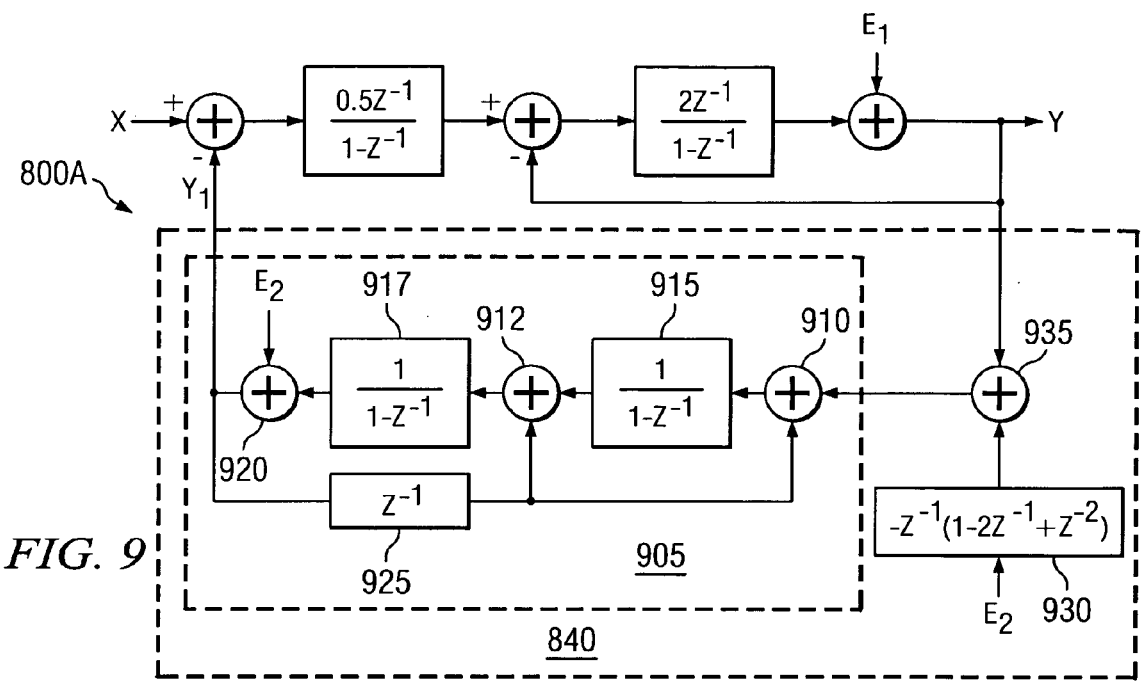
FIG. 9 is a diagram of the second-order sigma-delta modulator with its outermost feedback loop replaced with a circuit with an equivalent transfer function, according to a preferred embodiment of the present invention.

With reference now to FIG. 9, there is shown a diagram illustrating an exemplary second-order sigma-delta modulator 800A with its outermost feedback loop 840 replaced with a circuit with an equivalent transfer function, according to a preferred embodiment of the present invention. The second-order sigma-delta modulator 800A is the same as the second-order sigma-delta modulator 800 of FIG. 8 with its outermost feedback loop 840 having been replaced with a circuit having an equivalent transfer function. This may be the result of an initial application of the algorithm 700 from FIG. 7.

The outermost feedback loop 840 may be initially replaced with a circuit 905, which has a unity transfer function. The circuit 905 can be an embodiment of the circuit 400 from FIG. 4. The circuit 905 comprises a pair of adders 910 and 912 and a pair of integrators 915 and 917. A noise source $E_1$ represents the quantization noise of the ADC. The truncation error between the output of the second-order sigma-delta modulator 800A and the DAC (not shown) in the circuit 905 may be represented as a noise source $E_2$ and an adder 920. A delay block 925 in the circuit 905 is fedback to the integrators 915 and 917 via the adders 910 and 912.

The third criterion states that the order of the noise shaping performed by the expanded feedback loops should be higher than the order of the noise shaping performed by the sigma-delta modulator (two in the second-order sigma-delta modulator 800A). Therefore, an additional term has to be added to the expanded outermost feedback loop 840 to increase the order of the noise shaping to more than two. The additional term (displayed as block 930), when multiplied with the noise source $E_2$ and combined with the circuit 905 via an adder 935 can change the order of the noise shaping of the expanded outermost feedback loop 840. With the additional term being expressible as: $z^{-1}(1-2z^{-1}+z^{-2})$, the output of the expanded outermost feedback loop 840 $Y_1$ can be expressed as:

$$Y_1 = Y - z^{-1}(1-2z^{-1}+z^{-2})E_2 + (1-z^{-1})^2 E_2 = Y + (1-z^{-1})^3 E_2.$$

If $Y_1$ was to become the output of the second-order sigma-delta modulator 800A, then the output of the second-order sigma-delta modulator 800A can change to:

$$Y = z^{-2}X + (1-z^{-1})^2 E_1 + z^{-2}(1-z^{-1})^3 E_2.$$

Figure 10:
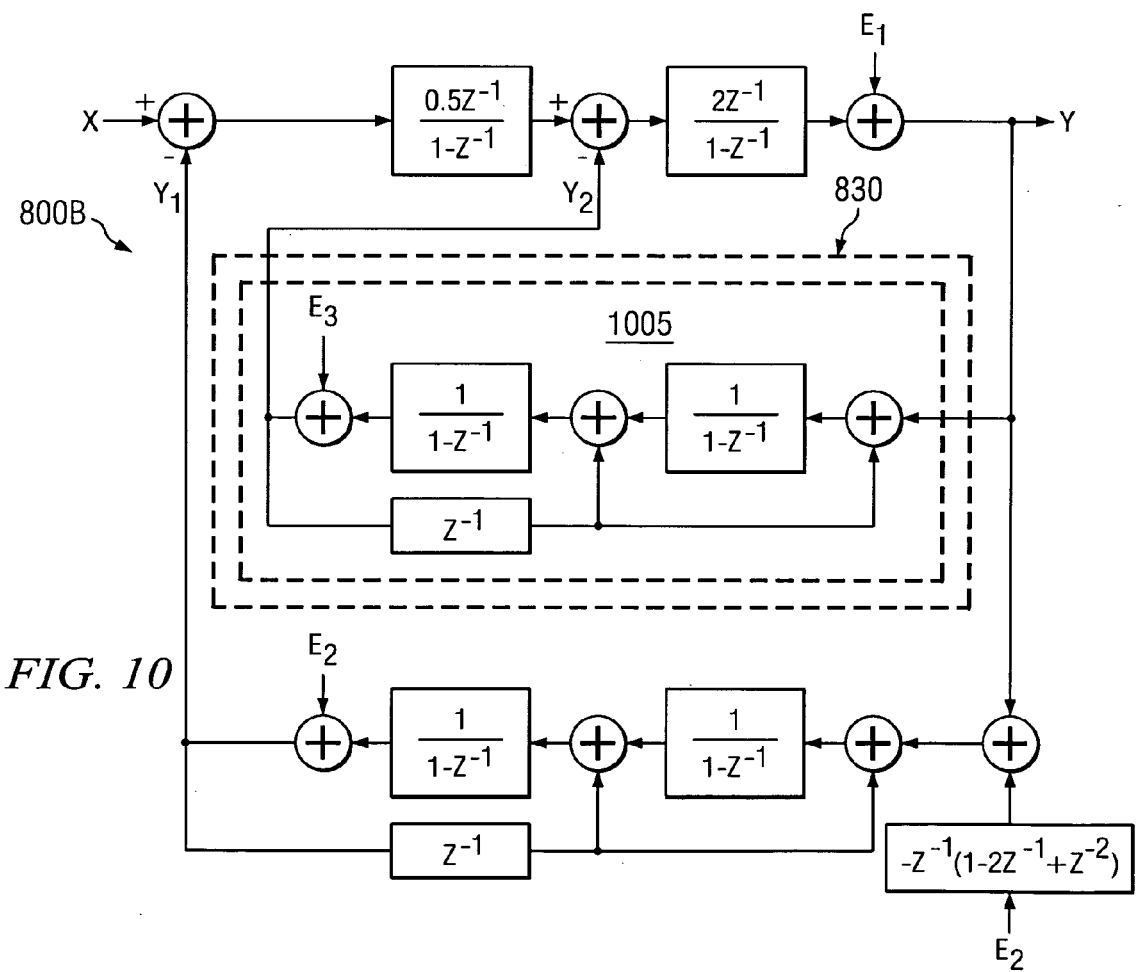
FIG. 10 is a diagram of the second-order sigma-delta modulator with its inner feedback loop replaced with a circuit with an equivalent transfer function, according to a preferred embodiment of the present invention.

With reference now to FIG. 10, there is shown a diagram illustrating an exemplary second-order sigma-delta modulator 800B with its inner feedback loop 830 replaced with a circuit with an equivalent transfer function, according to a preferred embodiment of the present invention. The second-order sigma-delta modulator 800B is the same as the second-order sigma-delta modulator 800A of FIG. 9 with its inner feedback loop 830 having been replaced with a circuit having an equivalent transfer function.

The inner feedback loop 830 may be replaced with a circuit 1005, which has a zero delay transfer function. The circuit 1005 can be an embodiment of the circuit 400 from FIG. 4. The circuit 1005 may be of a straight forward design with a pair of adders, a pair of integrators, and a delay block arranged in a configuration similar to the circuit 905 from FIG. 9. A noise source $E_3$, represents the truncation error between the output of the second-order sigma-delta modulator 800B and the DAC (not shown).

The output of the expanded inner feedback loop 830 $Y_2$ can be expressed as:

$$Y_2 = Y + (1-z^{-1})^2 E_3.$$

Therefore, the response of the second-order sigma-delta modulator 800B can now change to:

$$Y = z^{-2}X + (1-z^{-1})^2 E_1 - z^{-2}(1-z^{-1})^3 E_2 - 2z^{-1}(1-z^{-1})^3 E_3.$$

Note that the quantization error $E_3$ is noise shaped with a term $(1-z^{-1})^3$, because it is injected into the second integrator 820 (FIG. 8), which provides an additional $(1-z^{-1})$ term.

After expanding the feedback loops of a sigma-delta modulator, perhaps by using the algorithm 700 discussed above, it may be advantageous to determine the contribution from each of the noise sources in the sigma-delta modulator. This can be performed to determine the dominant source(s) of noise in the expanded sigma-delta modulator. In an expanded sigma-delta modulator, the sources of noise can be: the ADC quantization noise of the sigma-delta modulator and the truncation error contribution from each of the expanded feedback loops. For example, using the second-order sigma-delta modulator 800B discussed above and assuming an oversampling ratio (OSR) of 32 times the input signal data rate, the expanded outermost loop 840 (which is a third-order sigma-delta modulator) can provide an additional $Log_2(OSR) = Log_2(32) = 5$ bits of accuracy when compared to the second-order sigma-delta modulator 800 operating with the same OSR. Then, if the noise source $E_2$ is the result of a three-bit DAC with third-order noise shaping and the noise source $E_1$ is the result of a six-bit quantizer with second-order noise shaping, then the noise power of the noise source $E_2$ can be equivalent to 3 bits+5 bits=8 bits of accuracy if second-order noise shaping was used instead of third-order noise-shaping. This is a quarter (¼) of the noise source $E_1$'s noise power (eight bits as opposed to six bits). Therefore, the overall accuracy of the second-order sigma-delta modulator 800B may be dominated by the noise source $E_1$.

Figure 11:
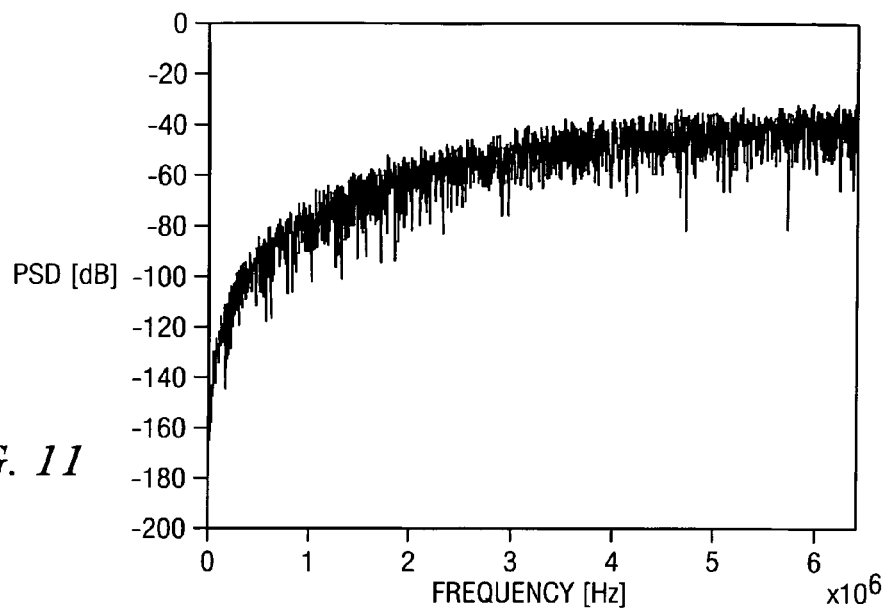
FIG. 11 is a power spectral density plot of a signal to be used as an input to the second-order sigma-delta modulator from FIG. 10, according to a preferred embodiment of the present invention.

With reference now to FIG. 11, there is shown a data plot illustrating a power spectral density plot of a signal to be used as an input to the second-order sigma-delta modulator 800B from FIG. 10, according to a preferred embodiment of the present invention. The data plot shows the spectral behavior of the input signal prior to being provided to the second-order sigma-delta modulator 800B.

Figure 12:
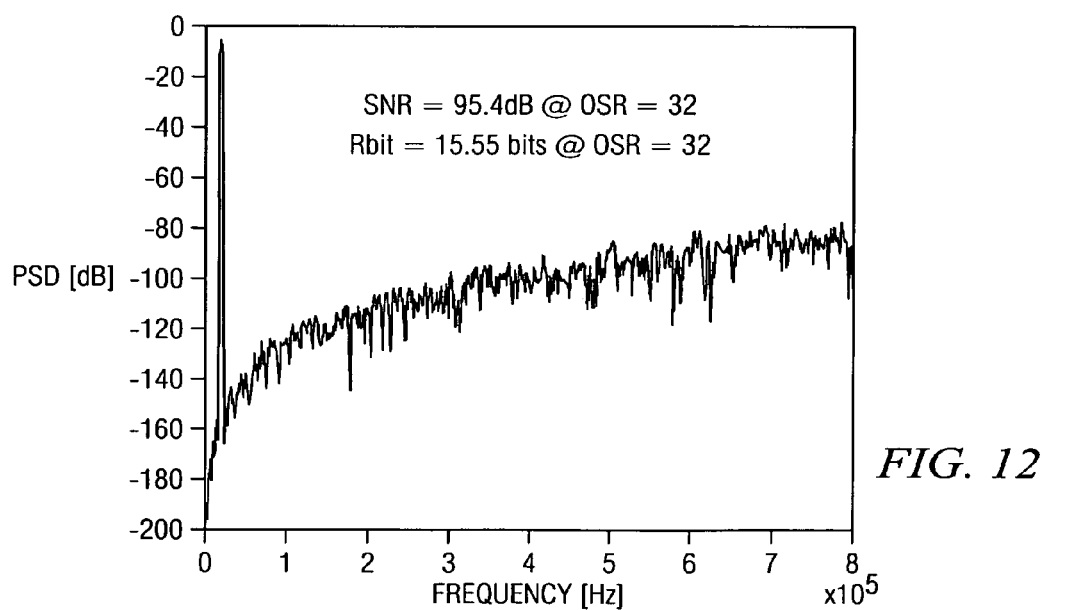
FIG. 12 is a power spectral density plot of a signal that is the output of the second-order sigma-delta modulator from FIG. 10, according to a preferred embodiment of the present invention.

With reference now to FIG. 12, there is shown a data plot illustrating a power spectral density plot of a signal that is the output of the second-order sigma-delta modulator 800B from FIG. 10, according to a preferred embodiment of the present invention. The data plot shows the spectral behavior of the output of the second-order sigma-delta modulator 800B. Clearly, when comparing the data plot of FIG. 12 with the data plot of FIG. 11, the power spectral density of the output of the second-order sigma-delta modulator 800B has been significantly attenuated.

Figure 13:
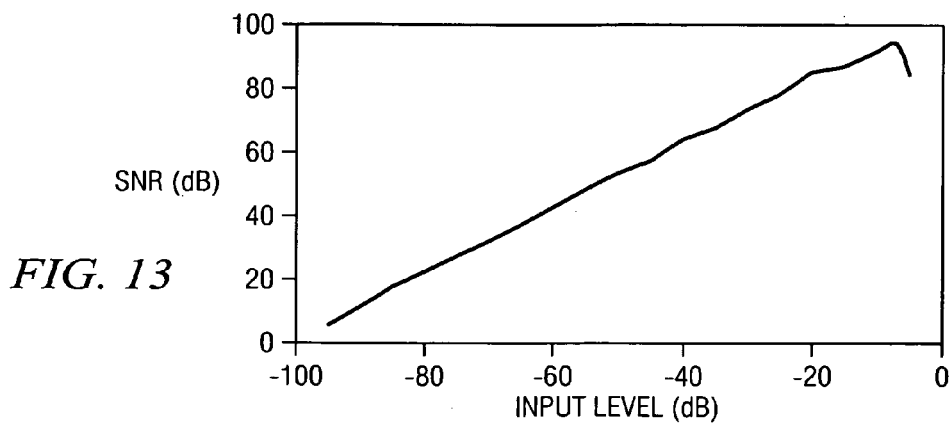
FIG. 13 is a data plot of the signal-to-noise ratio of the second-order sigma-delta modulator from FIG. 10 for various input signal levels, according to a preferred embodiment of the present invention.

With reference now to FIG. 13, there is shown a data plot illustrating the signal-to-noise ratio of the second-order sigma-delta modulator 800B from FIG. 10 for various input signal levels, according to a preferred embodiment of the present invention. The data plot shows that the second-order sigma-delta modulator 800B has a linearly increasing signal-to-noise ratio as the signal level of the input signal is increased.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for reducing resolution in a digital-to-analog converter (DAC) in a sigma-delta analog-to-digital converter (ADC), the method comprising:
   selecting an outermost feedback loop in the sigma-delta ADC;
   replacing the selected outermost feedback loop with a circuit with an equivalent transfer function;
   adding an additional term to the circuit if order of noise shaping performed by the circuit is less than the order of noise shaping performed by the sigma-delta ADC; and
   repeating the selecting, replacing, and adding for remaining feedback loops in the sigma-delta ADC.

2. The method of claim 1, wherein the outermost feedback loop is a feedback loop feeding an integrator closest to an input signal input.

3. The method of claim 1, wherein the circuit is a sigma-delta modulator.

4. The method of claim 3, wherein the sigma-delta modulator can be characterized by a resolution of a quantizer, wherein the sigma-delta ADC has an N-bit sized quantizer, wherein the sigma-delta modulator has an M-bit sized quantizer, and wherein N is greater than M.

5. The method of claim 4, wherein N is greater than the size of said quantizer in a circuit used to replace one of the feedback loops.

6. The method of claim 1, wherein the adding increases the order of the noise shaping performed by the circuit.

7. The method of claim 6, wherein the adding increases the order of the noise shaping performed by the circuit until it exceeds the order of the noise shaping performed by the sigma-delta ADC.

8. The method of claim 1, wherein the sigma-delta ADC has a certain amount of noise at its output, and wherein the noise is a sum of a quantization noise and a noise mismatch in unity elements used in the DAC.

9. The method of claim 8, wherein the quantization noise is the result of a finite resolution quantization of an input signal.

10. The method of claim 8, wherein the sigma-delta ADC further comprises a quantizer, and wherein the DAC has less resolution than the quantizer.

11. The method of claim 8, wherein the circuit introduces noise shaping to the outermost feedback loop.

12. The method of claim 11, wherein the circuit noise shapes the noise mismatch.

13. The method of claim 8, wherein the additional term is applied to the noise mismatch.

14. A method for converting a sub-net of sampled-data networks, the method comprising:
    verifying that the sub-net can be converted;
    selecting an outermost feedback loop;
    replacing the selected outermost feedback loop with a circuit with equivalent transfer function; and
    repeating the selecting and replacing for remaining feedback loops in the sub-net.

15. The method of claim 14, wherein verifying comprises:
    determining if the sub-net has a single signal input;
    determining if the sub-net has multiple noise inputs; and
    determining if the sub-net has no feed-forward and feedback loops crossing domains.

16. The method of claim 15, wherein the sub-net can be converted if all three determinings are true.

17. The method of claim 14, wherein the circuit is a sampled-data network.

18. The method of claim 17, wherein the circuit is a sigma-delta modulator.

19. The method of claim 14, wherein the sub-net is a sigma-delta ADC.

* * * * *